US012733128B2

(12) United States Patent
Ahlberg et al.

(10) Patent No.: US 12,733,128 B2
(45) Date of Patent: Sep. 8, 2026

(54) COOLING MODULE ASSEMBLY FOR POLE-MOUNTED NETWORK NODE

(71) Applicant: Telefonaktiebolaget LM Ericsson (publ), Stockholm (SE)

(72) Inventors: Ulf Ahlberg, Stockholm (SE); Stevin Wyk, Taby (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 289 days.

(21) Appl. No.: 18/710,539

(22) PCT Filed: Nov. 15, 2021

(86) PCT No.: PCT/SE2021/051139

§ 371 (c)(1),
(2) Date: May 15, 2024

(87) PCT Pub. No.: WO2023/085988

PCT Pub. Date: May 19, 2023

(65) Prior Publication Data

US 2025/0008682 A1 Jan. 2, 2025

(51) Int. Cl.
*H05K 7/20* (2006.01)
*H01Q 1/02* (2006.01)

(52) U.S. Cl.
CPC ........... *H05K 7/20163* (2013.01); *H01Q 1/02* (2013.01); *H05K 7/20309* (2013.01);
(Continued)

(58) Field of Classification Search
CPC ........... H05K 7/20163; H05K 7/20309; H05K 7/20327; H05K 7/20381; H05K 7/20418; H01Q 1/02
See application file for complete search history.

(56) References Cited

U.S. PATENT DOCUMENTS

2002/0006028 A1* 1/2002 Roberts .............. H05K 7/20163 361/695
2013/0222201 A1* 8/2013 Ma ......................... H01Q 1/246 343/834
(Continued)

FOREIGN PATENT DOCUMENTS

CA 3174501 A1 9/2021
EP 1843476 A1 * 10/2007 ........... H01Q 1/1207
(Continued)

OTHER PUBLICATIONS

European Patent Office, Supplementary European Search Report for EP Application No. 21964231, dated Jul. 4, 2025.

*Primary Examiner* — Tho V Duong
(74) *Attorney, Agent, or Firm* — FBT Gibbons LLP

(57) ABSTRACT

A cooling module assembly (100) for a network node in a telecommunication network is provided, including a support structure (110), attachment means (112) for attaching to a pole, a tubular section (120) providing a chimney effect, an air outlet (130), an air inlet (132), and at least two cooling modules (140). Each cooling module includes an enclosure (150) with a first outer side (152) having a radome section (153), and a second outer side (154) forming part of an enclosed inner air channel for cooling, the channel extending between the air inlet and the air outlet via the tubular section. Each module includes means for mounting radio modules within the enclosure, and heatsinks (160) in thermal contact with the inside of the enclosure and within the inner air channel. A corresponding cooling module, a network node and various street poles are also provided.

20 Claims, 7 Drawing Sheets

(52) U.S. Cl.
CPC ..... *H05K 7/20327* (2013.01); *H05K 7/20381* (2013.01); *H05K 7/20418* (2013.01)

(56) References Cited

U.S. PATENT DOCUMENTS

| | | | |
|---|---|---|---|
| 2016/0261030 | A1 | 9/2016 | Kim |
| 2021/0203061 | A1 | 7/2021 | Gerlinger |

FOREIGN PATENT DOCUMENTS

| | | | | | |
|---|---|---|---|---|---|
| EP | 2113963 | A1 | * | 11/2009 | ............. H01Q 1/246 |
| EP | 2389710 | B1 | | 8/2012 | |
| EP | 3033805 | B1 | | 5/2017 | |
| EP | 3396297 | A1 | * | 10/2018 | ............ H10W 40/43 |
| EP | 3514983 | A1 | | 7/2019 | |
| EP | 3565057 | A1 | | 11/2019 | |
| ES | 2725878 | T3 | * | 9/2019 | ............. H01Q 1/246 |
| JP | 2011108729 | A | | 6/2011 | |
| WO | WO-2021174319 | A1 | * | 9/2021 | ............ H10W 40/73 |
| WO | 2023085988 | A1 | | 5/2023 | |

* cited by examiner

COOLING MODULE ASSEMBLY FOR POLE-MOUNTED NETWORK NODE

This application is a national-phase entry under 35 USC § 371 of International Application No. PCT/SE2021/051139, filed Nov. 15, 2021, titled "Cooling Module Assembly for Pole-Mounted Network Node," the contents of which are hereby incorporated herein in its entirety.

TECHNICAL FIELD

The present disclosure relates to the field of network nodes for telecommunication networks. In particular, the present disclosure relates to a cooling module assembly for a network node mounted on a pole in an urban environment.

BACKGROUND

Due to the higher frequencies used in both e.g. fifth generation (5G), and sixth generation (6G), mobile communication systems, the radio signals emitted from the network nodes (such as base stations) have shorter usable range compared to older generation technologies. As a consequence, to still be able to reach the user, the network nodes must be installed closer to the user. In urban environments such as cities, a common solution has therefore been to install the network nodes on already existing structures, especially on various poles such as e.g. lighting poles, utility poles or traffic poles.

With an increasing number of such network nodes being installed in urban environments, public complaints have been raised about how the network nodes negatively impact the visual appearance of the city. In reaction to such complaints, cities all over the world have introduced local regulations and design guidelines for the visual appearance of the installed network nodes. For example, a cylindrical shape is often preferred, and cables has to be hidden from outside view as much as possible.

Available network nodes (such as small-cell base stations) are often designed taking only factors such as performance and cooling ability into account. As a result, these network nodes are often box shaped, and does not meet the above local regulations. This has led to a market for third-party, additional camouflages (such as e.g. shrouds, concealment poles, and similar) which fulfill the requirements for visual appearance, and in which the network nodes can be arranged.

However, although such additional camouflages may improve the visual appearance of the network nodes when seen from the outside, they also introduce several disadvantages. For example, the additional camouflages often increase the overall size (in terms of e.g. diameter, volume, etc.) of the installations. In addition, the additional camouflages also add additional cost, make servicing and repair of the network nodes more difficult, and negatively affect the ability to cool the network nodes. Traditional network node products often rely on heatsinks designed to be placed in open air. By having to arrange the network node products within the additional camouflages, one or more cooling fans are often required for each network node product to compensate for the reduced ambient air flow thus obtained while still keeping the overall size of the installation within limits. Such mechanical fans are prone to failure, and may require additional maintenance efforts and expenses during the lifetime of the network node. In particular, using multiple fans increases the risk of at least one fan failing. In addition, the additional camouflages can also negatively affect the radio performance of the network nodes as they add an additional layer through which the radio signals must pass.

SUMMARY

To at least partially overcome the above identified issues with currently available technology, the present disclosure provides an improved cooling module assembly for a network node in a telecommunication network, a cooling module for such a cooling module assembly, a network node, and a street pole as defined in the accompanying independent claims. Various alternative embodiments of the cooling module assembly, the cooling module, the network node, and the street pole are defined in the dependent claims.

According to a first aspect of the present disclosure, a cooling module assembly for a network node in a telecommunication network is provided. The assembly includes a support structure having (i.e. extending along) a longitudinal axis. The assembly further includes attachment means for attaching a first end of the support structure to a pole. The assembly further includes a tubular section extending along the longitudinal axis from a second end of the support structure, away from the first end, and to an air outlet. The assembly further includes an air inlet arranged at the first end. The assembly also includes at least two cooling modules each mounted to the support structure. Each of the at least two cooling modules include an enclosure. The enclosure includes a first outer side facing away from the longitudinal axis and a second outer side facing towards the longitudinal axis. The first outer side includes at least one radome section, and the second outer side forms part of an enclosed inner air channel of the assembly. The inner air channel extends along the longitudinal axis between the air inlet to the air outlet via the tubular section. Each of the at least two cooling modules further includes means for mounting one or more radio modules within the enclosure. Each of the at least two cooling modules also includes one or more heatsinks arranged on the second outer side and within the inner air channel, and in thermal contact with an inside of the enclosure.

Herein, that something (such as the tubular section and/or the inner air channel) extends "along" the longitudinal axis does not necessarily mean that they are coaxial with the longitudinal axis, but that they at least extend coaxially with some vector parallel to the longitudinal axis.

Herein, that the second outer side of a module "forms part of an enclosed inner air channel" is to be understood as that at least part of an outer perimeter of the enclosed inner air channel is the second outer side, or is at least the one or more heatsinks arranged on the second outer side if the heatsinks are such that they cover all of the surface of the second outer side. The second outer sides of all cooling modules may together define the full perimeter of the inner air channel, but it is envisaged also that part of the outer perimeter of the inner air channel may be formed by other parts of the cooling module assembly, such as for example parts of the support structure to which the cooling modules are mounted, or by one or more side cover plates provided for this purpose if the cooling modules are such that their combined outside area is not sufficient to define the full outer shape of the cooling module assembly. Also, that the inner channel is "enclosed" does not necessarily mean that it is completely air-tight in all radially outward directions. However, the inner air channel should be such that a combined area of any passages through which air may escape radially outwards is small compared to the total area of the perimeter enclosing the inner air channel. For example, the combined area of such passages should be at most a few percent of the total area of the perimeter, and preferably less. It is still however preferable to reduce any leakage of air (into and out from the inner air channel) in any radially outward direction, at any other place other than at dedicated air inlets and air outlets, to a minimum, or to zero. Each cooling module can also be environmentally sealed, and connections can be made within the enclosure of each cooling module without the need for any local, individual environment sealing of each radio equipment/module arranged therein or of its connectors. This may provide a reduced overall cost and complexity of the network node as a whole.

A "radio module" or "radio equipment" may for example include an antenna and the necessary integrated circuits, such as filters, amplifiers, beamformers, etc. needed to control and drive such an antenna. As each enclosure of the individual cooling modules is equipped with at least one radome section, the radio signals to/from such an antenna can pass through the enclosure with low enough attenuation/distortion. As used herein, it is envisaged that "an antenna" may refer to e.g. a single antenna element, but also to e.g. multiple antenna elements arranged to form an array antenna capable of e.g. beamforming, or similar.

A "network node" may for example be a base station, examples of which include e.g. radio base stations, node Bs, evolved node Bs (eNBs) and NR NodeBs (gNBs). A network node may also be e.g. an access point (AP), such as e.g. a radio access point, or similar. More generally, a network node as envisaged herein may e.g. include any point in a telecommunication network responsible for connecting a user equipment to e.g. a core network, or any point e.g. responsible for forming one part of a wireless connection between that particular point and another point on the network.

A "radome section" is for example a section created from a so-called radome material which has suitable properties for allowing radio signals to pass therethrough, without too much attenuation and/or distortion. Phrased differently, the radome material is transparent or at least semi-transparent to the frequencies involved. The word "section" is used to indicate that not all of the first side of the enclosure of a cooling module needs to be of the radome material, but only a part behind which the various antennas of the radio modules/equipment are supposedly arranged. It is envisaged that there may be a single or multiple such radome sections distributed over only part of the first outer side of the enclosure, or even that e.g. a single radome section may cover most or even all of the first outer side of the enclosure.

The cooling module assembly as disclosed herein improves upon already available technology in that the added tubular section (on top of the support structure and the cooling modules) interacts with the inner air channel to create a chimney effect wherein the air flow through the inner air channel is increased/enhanced. As the heatsinks of the cooling modules are located within the inner air channel, this helps to provide a more efficient cooling of radio equipment/modules arranged inside each enclosure, and eliminates the need for e.g. one or more mechanical fans to circulate the air. In particular, this improved cooling is also provided without negatively impacting the outside of the assembly in terms of visual appearance. To the contrary, the first outsides of the cooling modules together form the overall outside of the cooling module assembly, including any necessary radome sections, and can be adapted to meet local regulations for visual appearance without any need for additional camouflages such as third-party shrouds. The whole cooling module assembly can be mounted to for example an existing lighting pole, traffic pole or similar, or even mounted on a pole having the sole purpose of supporting the cooling module assembly of e.g. a ground. As will be described in more detail later, the cooling module assembly can thus be arranged such that it appears to form part of e.g. a lighting pole itself, which will lower the visual impact of the network node in an urban environment. If needed, the tubular section may even be used to mount one or more lighting arrangements (such as streetlights, traffic lights, or similar), making the integration of the cooling module assembly with urban structures even more seamless. In particular, as there is no need for external camouflages such as shrouds, the overall size of the cooling module assembly and the network node can be reduced, which further helps to lower the visual impact and appearance.

Another advantage of the proposed solution is that as the cooling modules are individually mounted to the support structure, individual cooling modules may be removed from the assembly while the other cooling modules still remain mounted and in operation, as the support structure to which the cooling modules are mounted provides most of the mechanical rigidity. This provides a flexible, modular system wherein for example service of one or more radio equipment/modules in a particular cooling module can be performed without having to dismantle or shutting down the full cooling module assembly. Instead, the cooling module including the radio equipment/module(s) in question can be taken out from the assembly, the radio equipment/module repaired or replaced, and the cooling module can then be inserted back into the assembly again. This helps to provide an improved uptime of the network node as a whole. In addition, it is envisaged that the radio equipment/module in each cooling module can also be upgraded or expanded in the future (e.g. to implement future radio communication technologies not already rolled out or implemented today), without needing to take down the whole cooling module assembly and also risk having to disable any city pole structure to which the cooling module assembly is mounted.

In one or more embodiments of the assembly, the assembly may further include a fluid-based heat exchanging system. The heat exchanging system may include a heat emitter unit arranged at the second end of the support structure and at least partially in thermal contact with the inner air channel (for example, one or more heatsinks of the heat emitter may also be arranged within the inner air channel, in addition to those already arranged on the second outer sides of the enclosures). The heat exchanging system may further include one or more heat absorber units arranged in thermal contact with one or more of the insides of the enclosure of the at least two cooling modules. The heat exchanging system may also include one or more conduits forming one or more loops between the heat emitter unit and the one or more heat absorber units (such that a cooling fluid can be circulated between the heat emitter unit and the one or more heat absorber units). Including a fluid-based heat exchanging system as described above may further improve the cooling of the various radio equipment/modules within the enclosure of a cooling module. The heat emitter unit may be arranged such that it is in thermal contact with the inner air channel. The heat unit may also be arranged such that it is in contact with the ambient air surrounding the cooling module assembly. The airflow within the inner air channel may help to draw ambient air from outside of the assembly, through/past e.g. one or more heatsinks of the heat emitter unit and into the inner air channel and further up via the tubular section. This flow of ambient air through/past the heat emitter may help to cool the heat emitter, and potentially also provide an improved air flow and cooling in the inner air channel, by possibly entraining additional air through the air inlet at the bottom of the inner air channel. If visible from the outside, the heat emitter unit can be adapted such that it does not negatively affect the visual appearance of the cooling module assembly from the outside. Alternatively, or in addition, the heat emitter unit may be covered with e.g. a more visually appealing grating or cover, through which air may still be exchanged between the heat emitter unit and the outside ambient air. Such a cover would only be local at the location of the heat emitter unit, and not effect e.g. the radio properties of the enclosure of the cooling modules, etc.

In one or more embodiments of the assembly, the fluid-based heat exchanging system may be formed by (or as) multiple subsystems. Each such subsystem may be included as part of a respective one of all, or some, of the at least two cooling modules. In other embodiments, it is envisaged that e.g. the heat emitter unit is shared between all cooling modules, but that each cooling module still has a dedicated heat absorber unit in thermal contact with the inside of its enclosure. Each heat absorber unit may for example be arranged in thermal contact only with locations inside the enclosure where heat produced by the radio equipment/modules is particularly high. The remaining parts of the enclosure can still be cooled by the heatsinks of the enclosure itself, arranged on its second outer side and within the inner air channel.

In one or more embodiments of the assembly, the fluid-based heat exchanging system may be so arranged that it provides a second air inlet to the internal air channel. As described earlier herein, if the heat emitter unit includes one or more heatsinks (such as multiple cooling fins), these heatsinks may be arranged such that air may pass from the outside of the cooling module assembly, through and past the heatsinks, and then enter into the inner air channel and further up into to tubular section. In addition to providing cooling of the heat emitter unit itself, as the heat emitter unit is arranged at the second end of the support structure, the additional air entering through/past the heat emitter unit and up into the tubular section may also help to entrain additional air from the air inlet (at the bottom) and through the inner air channel below the heat emitter unit, thereby increasing/enhancing the air flow within the inner air channel. Of course, also using the fluid-based heat exchange system can increase the overall cooling power of the cooling module assembly, for each enclosure.

In one or more embodiments of the assembly, the fluid-based heat exchanging system may be a two-phase system. In such a system, the heat emitter unit may be a condenser unit (wherein a gas is condensed into liquid, thereby releasing heat), and the one or more heat absorber units may be one or more evaporator units (wherein the liquid is evaporated into the gas, thereby absorbing heat). Such a system may be more efficient than e.g. a single-phase system relying only on a liquid-phase everywhere in the system.

In one or more embodiments of the assembly, the fluid-based heat exchanging system may be a single-phase system, and use e.g. a cooling liquid in liquid phase everywhere in the system.

In one or more embodiments of the assembly, the fluid-based heat exchanging system may further include at least one pump for actively circulating a cooling liquid in the one or more loops. An increased circulation of cooling liquid may further enhance the cooling power of the heat exchanging system.

In one or more embodiments of the assembly, the heat emitter may be arranged closer to the air outlet than the parts of the inner air channel formed by the second outer sides of the two or more cooling modules. This may be the case if for example there is a single heat emitter shared by all or more than one cooling module. Arranging the heat emitter unit further "up" may for example help to expose the heat emitter unit to the ambient conditions more directly and thereby obtain an increased thermal capacity when dissipating heat. The heat emitter unit may also generate its own chimney flow (via the second air inlet, through the heat emitter unit and up through the tubular section). Such a chimney flow may also possibly enhance the chimney flow below (i.e. in the inner air channel) by entrainment.

In one or more embodiments of the assembly, the assembly may include exactly two or three cooling modules. Two or three modules may be adequate to cover a desired area. For example, if an antenna of the radio module/equipment cover approximately 120 degrees horizontally, two cooling modules may be enough to cover 240 degrees horizontally. A 240-degree coverage may be suitable if the assembly is for example arranged to provide coverage of a longer street or avenue, where users are normally located along the street/avenue and in directions normal to the antenna(s). If a total cover of 360 degrees horizontally is instead desired, using three cooling modules in total may then be more adequate.

In one or more embodiments of the assembly, the second outer sides of the modules may define at least part of an outer shape of the assembly. Here, it may be envisaged e.g. that the assembly has an outer shape of a cylinder, and e.g. that the second outer side of each cooling module forms a part of this cylinder shape. It should be noted that the assembly does not have any own, physical outer shape (such as a cover, or shroud), but that the outer shape is formed by the physical outer shapes of each module, in combination with other structures such as the support structure and e.g. various cover plates if needed.

In one or more embodiments of the assembly, the outer shape of the assembly may be cylindrical or oval, or at least be approximately cylindrical or oval. The second outer shape of each cooling module may then constitute an angular section of such a cylinder, such as for example 120 degrees of the full 360-degree cylinder surface. As mentioned earlier herein, a cylindrical outer shape may be preferable from an aesthetical point of view.

According to a second aspect of the present disclosure, a cooling module for a cooling module assembly for a network node in telecommunication network is provided. The cooling module includes an enclosure. The enclosure includes a first outer side and a second outer side. The first outer side includes a radome section. The cooling module further includes means for mounting one or more radio modules/equipment within the enclosure. The cooling module also includes one or more heatsinks arranged on the second outer side and in thermal contact with an inside of the enclosure. The cooling module is further so configured that, when mounted to a support structure of the cooling module assembly having (i.e. extending along) a longitudinal axis, together with one or more other such cooling modules, the first outer side faces away from the longitudinal axis, and the second outer side faces towards the longitudinal axis and forms at least part of an enclosed inner air channel of the assembly. The inner air channel is formed between the second outer sides of the cooling module and the one or more other such cooling modules, such that the one or more heatsinks are arranged within the inner air channel.

Such a cooling module may be used in a cooling module assembly as described earlier herein with reference to the first aspect, with all the advantages associated therewith.

In one or more embodiments of the cooling module, the cooling module may further include a fluid-based heat exchanging system. The heat exchanging system may include a heat emitter unit configured to be in thermal contact with the inner air channel, one or more heat absorber units arranged in thermal contact with the inside of the enclosure, and one or more conduits forming one or more loops between the heat emitter unit and the one or more heat absorber units.

In one or more embodiments of the cooling module, the fluid-based heat exchanging system may be a two-phase system, the heat emitter unit may be a condenser unit, and the one or more heat absorber units may be one or more evaporator units.

In one or more embodiments of the cooling module, the fluid-based heat exchanging system may be a single-phase system.

In one or more embodiments of the cooling module, the fluid-based heat exchanging system may further include at least one pump for actively circulating a cooling liquid in the one or more loops.

According to a third aspect of the present disclosure, a network node for a telecommunication network is provided. The network node includes a cooling module assembly according to e.g. the first aspect, and at least one radio module/equipment mounted within each enclosure of the two or more cooling modules.

Such a network node has all the advantages discussed already herein, with reference e.g. to the cooling module assembly of the first aspect.

In one or more embodiments of the network node, the network node may be configured to serve a number of sectors. Each cooling module assembly may include one cooling module for each sector. For example, if a cooling module is configured to cover a sector of 120 degrees horizontally, and the network node is supposed to serve three such sectors, the network node may be configured such that the cooling module assembly includes exactly three cooling modules.

According to a fourth aspect of the present disclosure, a street pole is provided. The street pole includes a base for attaching to a ground structure or to a wall structure. The street pole further includes a pole structure having a first end and a second end, wherein the first end is attached to the base. The street pole also includes a network node according to e.g. the third aspect. The support structure of the cooling module assembly of the network node is mounted to the second end of the pole.

Such a street pole may have a less visually disturbing appearance, while still including the necessary network node for providing telecommunication services within e.g. a city. This because, using the envisaged cooling assembly module, the network node can be made to appear as being part of the street pole itself, without any additional camouflage or similar, and while still providing sufficient cooling of the radio modules/equipment therein. In particular, the tubular section of the cooling module assembly can be colored, shaped and overall configured such that it is hard to determine for a spectator whether it is part of the pole structure of the street pole itself.

In one or more embodiments of the street pole, the street pole may further include a lighting arrangement (such as a streetlight, a traffic light, or similar). The lighting arrangement may be attached to the tubular section of the cooling module assembly. As discussed above, this may further enhance the appearance of the cooling module assembly as being part of the street pole itself.

These and other objects and advantages of the present disclosure will be apparent from the following detailed description, the drawings and the claims. Within the scope of the present disclosure, it is envisaged that all features and advantages described with reference to e.g. the cooling module assembly of the first aspect are relevant for, apply to, and may be used in combination with also the cooling module of the second aspect, the network node of the third aspect, and the street pole of the fourth aspect, and vice versa.

BRIEF DESCRIPTION OF THE DRAWINGS

Exemplifying embodiments will be described below with reference to the accompanying drawings, in which.

Figure 1A:
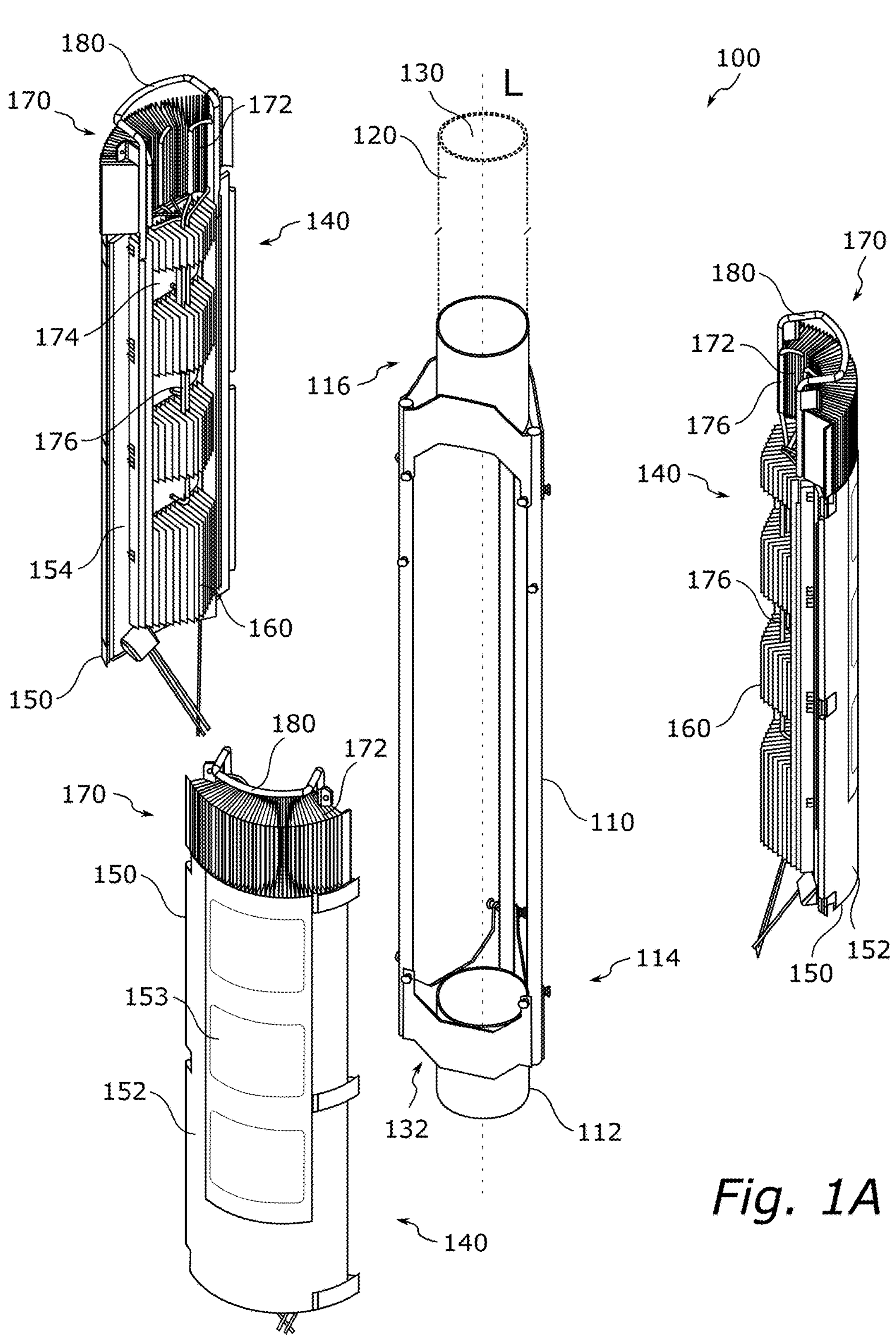
FIG. 1A schematically illustrates an exploded perspective view of an embodiment of a cooling module assembly according to the present disclosure.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the Figures, the sizes (absolute or relative) of elements and regions may be exaggerated or understated vis-à-vis their true values for illustrative purposes and, thus, are provided to illustrate the general structures of the embodiments.

DETAILED DESCRIPTION

Exemplifying embodiments of a cooling module assembly, a cooling module, and a street pole according to the present disclosure will now be described more fully hereinafter with reference to the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the present disclosure to the skilled person. In what follows, the terms "cooling module assembly" and just "assembly" will be used interchangeably. This applies also to the terms "cooling module" and "module", which will be used interchangeably as well.

An embodiment of an assembly according to the present disclosure will now be described with reference to FIGS. 1A-C.

FIG. 1A schematically illustrates an exploded perspective view of an assembly 100. The assembly 100 includes a support structure 110, which extends along a longitudinal axis L from a first end 114 to a second end 116. There are attachment means 112 provided for attaching the first end 114 to e.g. a pole, such as a street pole, utility pole, traffic light pole, or similar. The attachment means 112 can for example include a screw clamp which, when tightened, may grip around the pole and thereby secure the support structure 100 to the pole. Other solutions are also envisaged, using for example one or more screws, bolts, nuts, adhesives, or similar, as long as the support structure 110 may be suitable fixed to the pole using the attachment means 112.

In the particular example illustrated in Figure TA, the support structure 110 includes three arms which extends from the first end 114 to the second end 116, also along the longitudinal axis L. A tubular section 120 extends from the second end 116 of the support structure 110 along the longitudinal axis L, and away from the first end 114. At the end of the tubular section 120, there is provided an air outlet 130. In the particular example illustrated in Figure TA, the air outlet 130 is formed by the open end of the tubular section 120 furthest away from the second end 116 of the support structure 110. In other embodiments, the air outlet 130 may instead, or in addition, be arranged e.g. as an opening on the side of the tubular section 120, but still preferably close to the end of the tubular section 120 furthest away from the second end 116 of the support structure 110. In the particular example illustrated in Figure TA, the tubular section 120 is shaped like a cylindrical tube. In other embodiments, it is envisaged that the tubular section 120 may instead have other outer shapes, such as e.g. oval, square, rectangular or similar, as long as the inside of the tubular section 120 is hollow and such that the tubular section 120 is such that air may enter at, or towards, one end of the tubular section 120 and exit at, or towards, another end of the tubular section 120. The desired function of the tubular section 120 is to act as a conduit for air, transporting air along the longitudinal axis L from the second end 116 of the support structure 110 and towards the end of the tubular section 120 furthest away from the second end 116 of the support structure 110, in order to create a chimney effect.

There is also an air inlet 132 arranged at the first end 112 of the support structure 110. As illustrated in Figure TA, this air inlet 132 may for example be created by there being an opening between the three arms of the support structure 110 and the attachment means 112, such that air may enter in this opening. In other embodiments, the air inlet 132 may instead, or in addition, for example be provided as an opening on the side of the attachment means 112, or similar. In some embodiment, it could even be envisaged that the air inlet 132 is arranged such that the air that enters therein is not the ambient air surrounding the assembly 100, but e.g. provided through the pole through which the support structure 110 is mounted (assuming that the pole is hollow and in turn leads to some source of air suitable for cooling of the assembly 100).

The assembly 100 further includes three modules 140. Although not visible in Figure TA due to the exploded view, these three modules 140 are all mounted to the support structure using e.g. a screw connection, or similar, to the three arms of the support structure 110. If a module 140 is for example configured to cover a sector of 120 degrees horizontally, the assembly 100 may thus be suitable for covering a total of three such sectors, resulting in a 360-degree coverage horizontally.

Each one of the modules 140 includes an enclosure 150 which in turn includes a first outer side 152 that faces away from the longitudinal axis L, and a second outer side 154 that faces towards the longitudinal axis L. The first outer side 152 includes at least one radome section 153. In the particular example illustrated in Figure TA, the enclosure 150 of a module 140 includes three such radome sections 153, which is suitable if there are for example three antennas (not shown) to be arranged within the enclosure 150. The exact number of radome sections 153 for each module 140 may of course be adapted to the desired number of antennas within each enclosure 150, and the exact positions of these radome sections 153 on the enclosure 150 may also be arranged according to where exactly the antennas are located within the enclosure 150. In other embodiments, there may e.g. be a single radome section 153 that covers all or most of the first outer side 152.

As will be explained in more detail with reference to FIG. 1C, the second outer sides 154 of the enclosures 150 together form an enclosed inner air channel of the assembly 100. The inner air channel extends along the longitudinal axis L between the air inlet 132 and to the air outlet 130, via the tubular section 120. Although not illustrated in Figure TA, each enclosure 150 also includes means for mounting various radio modules/equipment within the enclosure 150.

In the assembly 100, each module 140 also includes one or more heatsinks 160. The heatsinks 160 of each module 40 are arranged on the second outer side 154 such that they at least partially extend into the inner air channel formed between the three modules 140. The heatsinks 160 are also in thermal contact with an inside (not shown) of the corresponding enclosure 150, such that they may help to transport heat from within the enclosure 150 to the inner air channel formed between the modules 140, such that the heat can then be transported away up through the tubular section 120 as a result of the chimney effect created by adding the tubular section 120 in addition to the inner air channel formed between the modules 140. Here, "chimney effect" is used to refer to the phenomena where hot air is accelerated upwards due to e.g. a pressure difference between the inside and outside of an object, thereby increasing the intake of new, cooler air at the bottom of the channel and creating an increased air flow, which in turn leads to an improved cooling. For the chimney effect to work as intended, the assembly 100 should be installed such that the longitudinal axis L at least approximately equals the axis of gravitational force at the installation site (phrased differently, the assembly 100 should optimally be arranged standing up, and not lying down, with the tubular section extending on top, and the first end 112 and the air inlet 132 at bottom).

In the particular example illustrated in Figure TA, the assembly 100 also includes an additional fluid-based heat exchanging system 170 (hereinafter referred to as simply the "system"). It should be noted that in other envisaged embodiments of the assembly 100, the system 170 may be optional. As shown in Figure TA, each module 140 includes its own system 170. In other embodiments, it is envisaged that for example some parts of the system 170 may be shared between all modules 140, for example a single, common heat emitter 172.

The system 170 for each module 140 includes a heat emitter unit 172 which is arranged at the second end 116 of the support structure. The heat emitter unit 172 is further at least partially in thermal contact with the inner air channel formed between the modules 140. This is achieved, in this example, by arranging the heat emitter unit 172 such that it partially extends into the inner air channel. As shown in Figure TA, the heat emitter unit 172 has a plurality of cooling fins (or heat exchangers), and these cooling fins partially extend into the inner air channel. The system 170 further includes one or more heat absorber units 174 which are arranged in thermal contact with the inside of the enclosure 150. For example, the heat absorber unit 174 may be a metal plate having suitable thermal properties (such as e.g. copper, aluminium, or similar), which forms part of the second outer side 154 of each enclosure 150 and extends into the inside of each enclosure 150. The system 170 also includes a plurality of conduits 176, which are arranged such that they form loops between the heat emitter unit 172 and the one or more heat evaporator units 174, such that a cooling fluid may be circulated between the heat emitter unit 172 and the heat absorber units 174 (either in a single phase, or including at least one phase change). The number of heat absorber units 174 in each module 140 may for example be adapted to the number of radome sections 153 and/or to the expected number of radio modules/equipment that are to be mounted within the enclosure 150. In the particular example illustrated in Figure TA, there are three radome sections 153 for each module 140, and correspondingly three heat absorber units 174 in each system 170. Of course, there may be equipment within each enclosure 150 that does not require a dedicated radome section (i.e. equipment without antennas). A corresponding heat absorber unit 174 may then of course be provided also for such equipment within the enclosure 150.

The system 170 may be used to even further improve the cooling of the radio modules/equipment arranged in the enclosures 150 of the modules 140.

In this and other embodiments wherein the system 170 is present, the system 170 may for example be of a two-phase type, wherein a phase transition between e.g. a gas phase and a liquid phase is used to further enhance the amount of heat which may be transported away by the system 170. For example, the heat emitter unit 172 may be a condenser unit wherein a gas is condensed into liquid. Likewise, the heat absorber units 174 may be evaporator units wherein the liquid is evaporated into a gas. In other embodiments including the system 170, the system 170 may instead be of a single-phase type, i.e. without any phase transitions and with e.g. only a liquid-phase of the cooling medium. A single-phase system may e.g. offer advantages in terms of improved design flexibility, possibility to adjust flow rate, etc.

Overall, the system 170 may for example be a thermosiphon system or similar. In some embodiments, one or more pumps may be provided for actively circulating a cooling liquid in the one or more loops created by the conduits 176. This may be particularly relevant if using only a single-phase system 170. In other embodiments, such as those including the system 170 as illustrated in FIGS. 1A-1C, the system 170 can be passive without any active elements consuming electricity to operate. This may further reduce operating costs, and improve reliability as there are no mechanically moving components that risk failing after a certain operating time.

In the particular example illustrated in Figure TA, the assembly 100 is such that each module 140 further includes a handle 180. The handle 180 can of course be optional in other embodiments, but may be useful e.g. to carry and handling the modules 140 during e.g. installation, repair or replacement. The handle 180 may also protect the module 140 from impact forces if e.g. dropped or hit by an object.

Figure 1B:
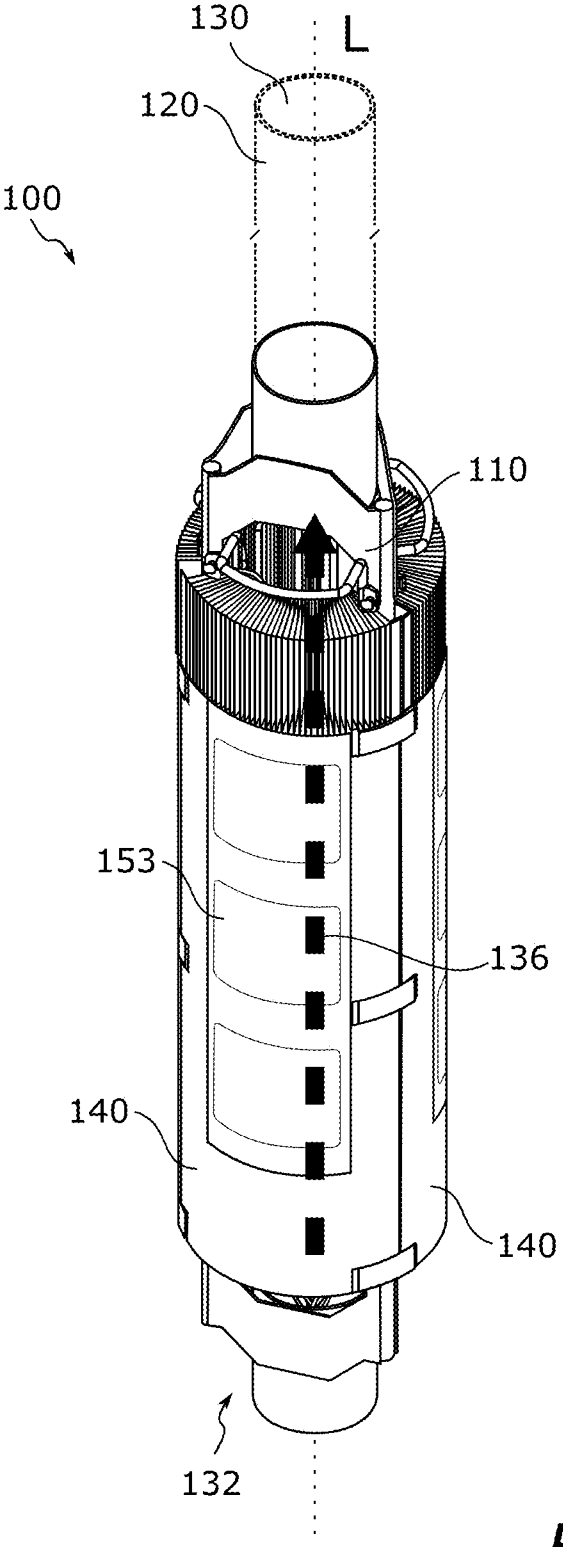
FIG. 1B schematically illustrates a non-exploded perspective view of the cooling module assembly of Figure TA.

FIG. 1B schematically illustrates a non-exploded perspective view of the same assembly 100 as illustrated in, and described with reference to, FIG. 1A. The modules 140 is in FIG. 1B seen as they are actually mounted to the support structure 110, and the envisaged inner air channel formed between the modules 140 is illustrated with the dashed arrow 136.

Figure 1C:
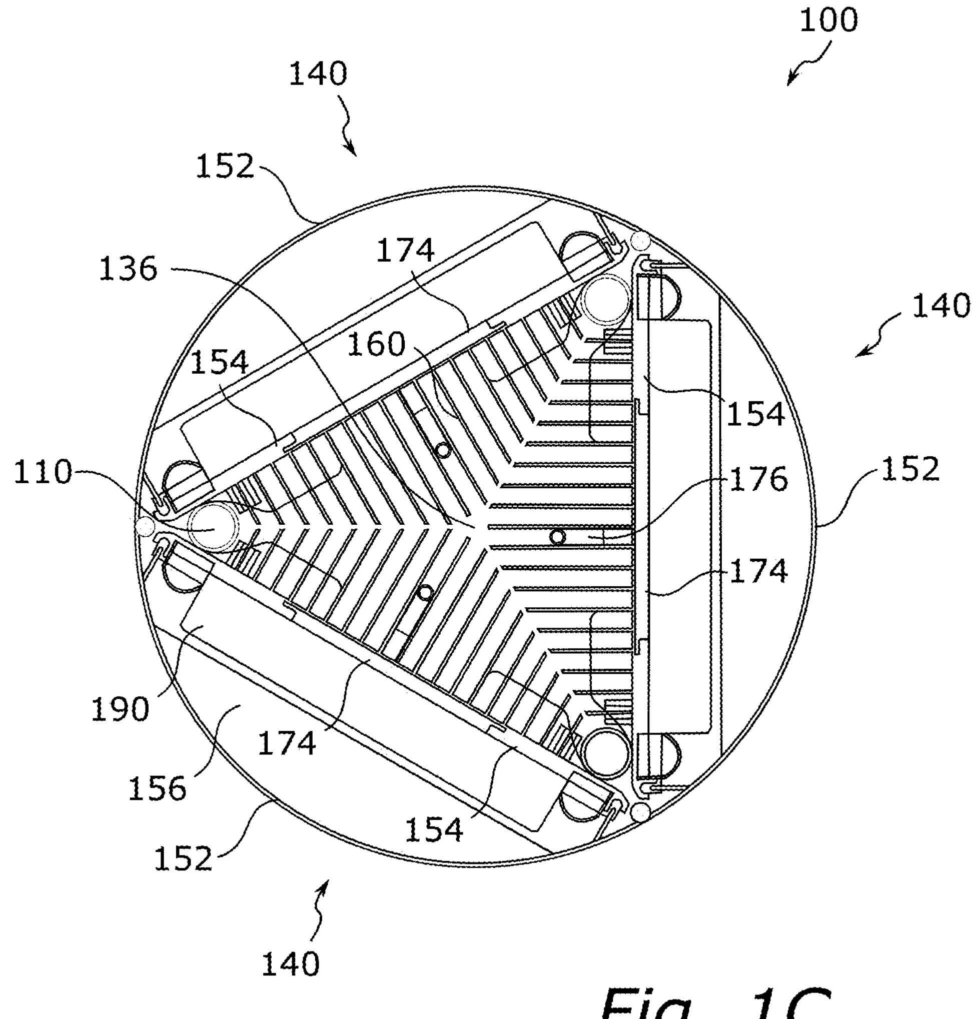
FIG. 1C schematically illustrates a cross-section of the cooling module assembly of FIGS. 1B and 1B.

FIG. 1C schematically illustrates a cross-section of the assembly 100 already described with reference to FIGS. 1A and 1B. In FIG. 1C, it can be seen in more detail how the various first outer sides 152 of the enclosures together define the overall outer shape of the assembly 100. The dashed arrow 136 also indicate the enclosed, inner air channel formed between the first inner sides (not visible in FIG. 1B) of the enclosures.

As the assembly 100 also includes the system (i.e. the fluid-based heat exchanging system), the heat absorber units 174 of each module 140 are also shown, and it can be seen how the heat absorber units 174 form part of the second outer sides 154 of the enclosures and extend into the inside of the enclosure, such that they can improve the overall cooling by transporting additional heat away from the inside of the enclosure and towards the heat emitter unit (not shown) using the conduits 176. This may reduce a thermal loading of the heatsinks 160 shown in Figure TA.

As illustrated in FIG. 1C, it is assumed that the modules 140 are such that their first outer sides 152 together form part of a cylindrical outer shape of the assembly 100. It may, however, and as described earlier herein, also be envisaged that the modules 140 as envisaged herein are such that the outer shape of the assembly is not cylindrical, and instead e.g. oval, square, rectangular, triangular, or similar. However, a cylindrical or at least approximately cylindrical outer shape may be preferable due to local regulations with respect to the visual appearance of network nodes located in urban environments. It is in all cases envisaged that the modules 140 are such that their second outer sides 152 are such that they, when mounted to the support structure of the assembly, help to define the enclosed, inner air channel important for the cooling of the assembly and the modules.

The airflow within an embodiment of an assembly as envisaged herein will now be described in more detail with reference to FIG. 1D.

Figure 1D:
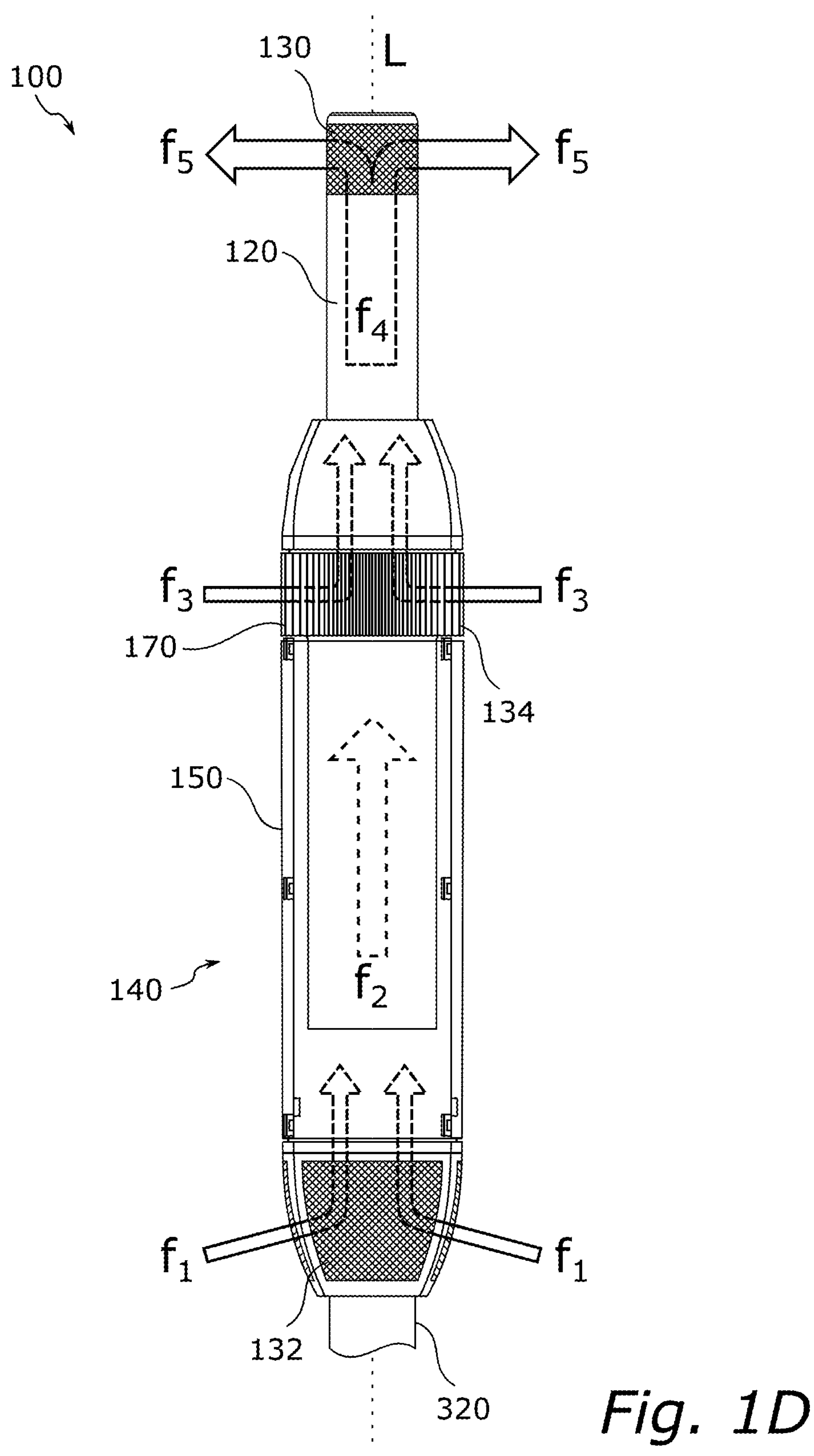
FIG. 1D schematically illustrates a side view of an embodiment of a cooling module assembly according to the present disclosure, and in particular an example air flow through such an assembly.

FIG. 1D schematically illustrates a side view of an assembly 100, which may or may not be exactly the same as the assembly 100 or 101 described herein already with reference to Figures TA-C. The assembly is arranged vertically (standing up, with the longitudinal axis L extending in an up/down direction), and is mounted at its bottom to a pole 320. The air inlet 132 is located at the bottom, and the air outlet 130 is located at the top, at the top end of the tubular section 120. Due to the enclosed, inner air channel formed between the modules 140, air can enter at the bottom air inlet 132 (as indicated by the arrows $f_1$), continue up through the inner air channel (as indicated by the arrow $f_2$), and then move on through the tubular section 120 (as illustrated by the arrow $f_4$) before exiting through the air outlet 130 arranged on top (as illustrated by the arrows $f_5$). In particular, the chimney effect created by the addition of the tubular section 120 helps to further accelerate the air within the cooling assembly upwards, and results in an increased air flow through the inner air channel (the flow $f_2$). This provides an improved cooling, and without requiring any modifications of the outside of the assembly 100 which would risk negatively impacting its visual appearance.

The visual appearance of the assembly 100 is governed mainly by the shape of the enclosures 150, and in particular of the shape of the first outer sides of the enclosures (which face outwards, towards a spectator located on the outside of the assembly 100). As mentioned earlier herein, the first outer sides of the enclosures 150 also form the overall outside of the assembly 100, and no additional camouflage in the form of e.g. a shroud is necessary.

As illustrated in FIG. 1D, the air inlet 132 and/or the air outlet 130 can be provided with cover gratings such that they are even less visible from the outside, but also to avoid dirt, leaves, and other unwanted objects and particles from entering into the air inlet 132 and e.g. getting stuck within the assembly 100. This can apply also to live objects, such as rodents, small birds, insects and similar, which could otherwise enter the assembly 100 e.g. to seek shelter from the environment. Arranging (as illustrated in FIG. 1D) the air outlet 130 on the side of the tubular section 120 can also prevent e.g. rain from easily enter down into the tubular section 120 and further into the air channel formed between the modules 140. In particular, if the air outlet 130 is arranged on the side of the tubular section 120, it can be envisaged that the tubular section 120 is sealed at its upper end, such that no objects can enter into the tubular section 120 from above (that is, moving only along the longitudinal axis L).

As also illustrated in FIG. 1D, if the assembly 100 includes the (fluid-based heat exchanging) system 170, this can be arranged such that it (using e.g. the heat emitter unit) forms a second air inlet 134 to the inner air channel. The air entering the second air inlet 134 (as illustrated by the arrows $f_3$) may for example help to cool the heat emitter unit, but also help to further accelerate the air within the tubular section 120, which in turn will also result in an increased airflow within the inner air channel. As described earlier herein, this can be further enhanced by the system 170 helping to release some of the heat generated within the enclosures 150 further up in the inner air channel, at the location of e.g. the heat emitter unit, instead of only at the position of the heatsinks 160 (not visible in FIG. 1D).

An alternative embodiment of an assembly according to the present disclosure will now be described in more detail with reference to FIG. 1E.

Figure 1E:
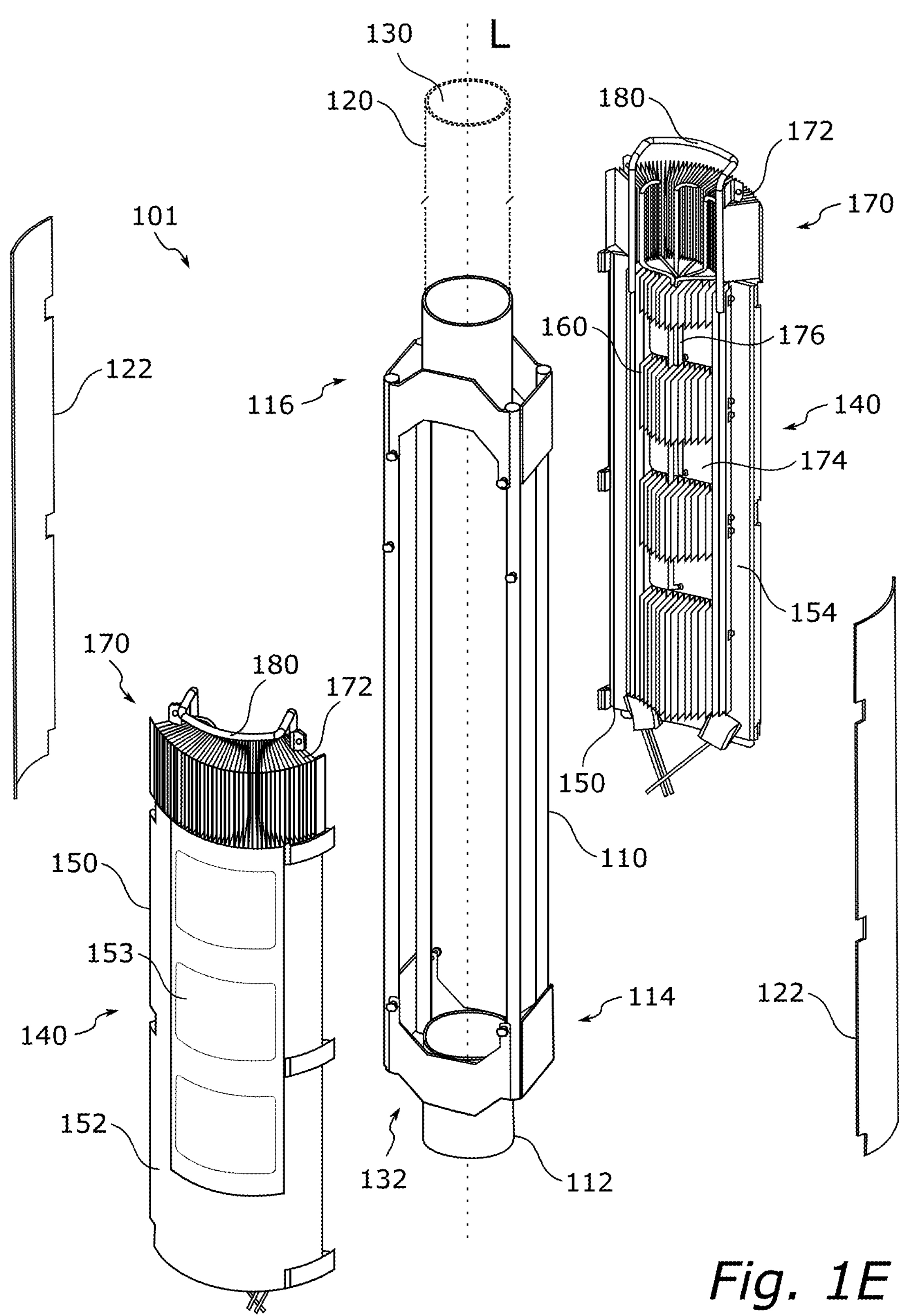
FIG. 1E schematically illustrates an exploded perspective view of another embodiment of a cooling module assembly according to the present disclosure.

FIG. 1E illustrates another embodiment of an assembly 101. The assembly 101 is equal to the assembly 100 illustrated in, and discussed with reference to, e.g. FIGS. 1A-C, except that it is configured with two modules 140 instead of three modules. Consequently, the support structure 110 is changed such that it can receive and mount the two modules 140, and for this purpose it has e.g. four legs instead of three, etc. As the first outsides 152 of the two modules 140 together do not span 360-degrees, additional side cover plates 122 are provided. This such that the two modules 140 and the side cover plates 122 together are still able to form the enclosed, inner air channel in between themselves. Except for there being only two modules 140 instead of three, the different support structure, and the additional side cover plates 122, it may be assumed that all other features of the assembly 101 are equal to those of the assembly 100. For this reason, no further discussion about the details of the assembly 101 is provided.

An embodiment of a cooling module (or just "module") 140 according to the present disclosure will now be described in more detail with reference to FIGS. 1F and 1G.

Figures 1F, 1G:
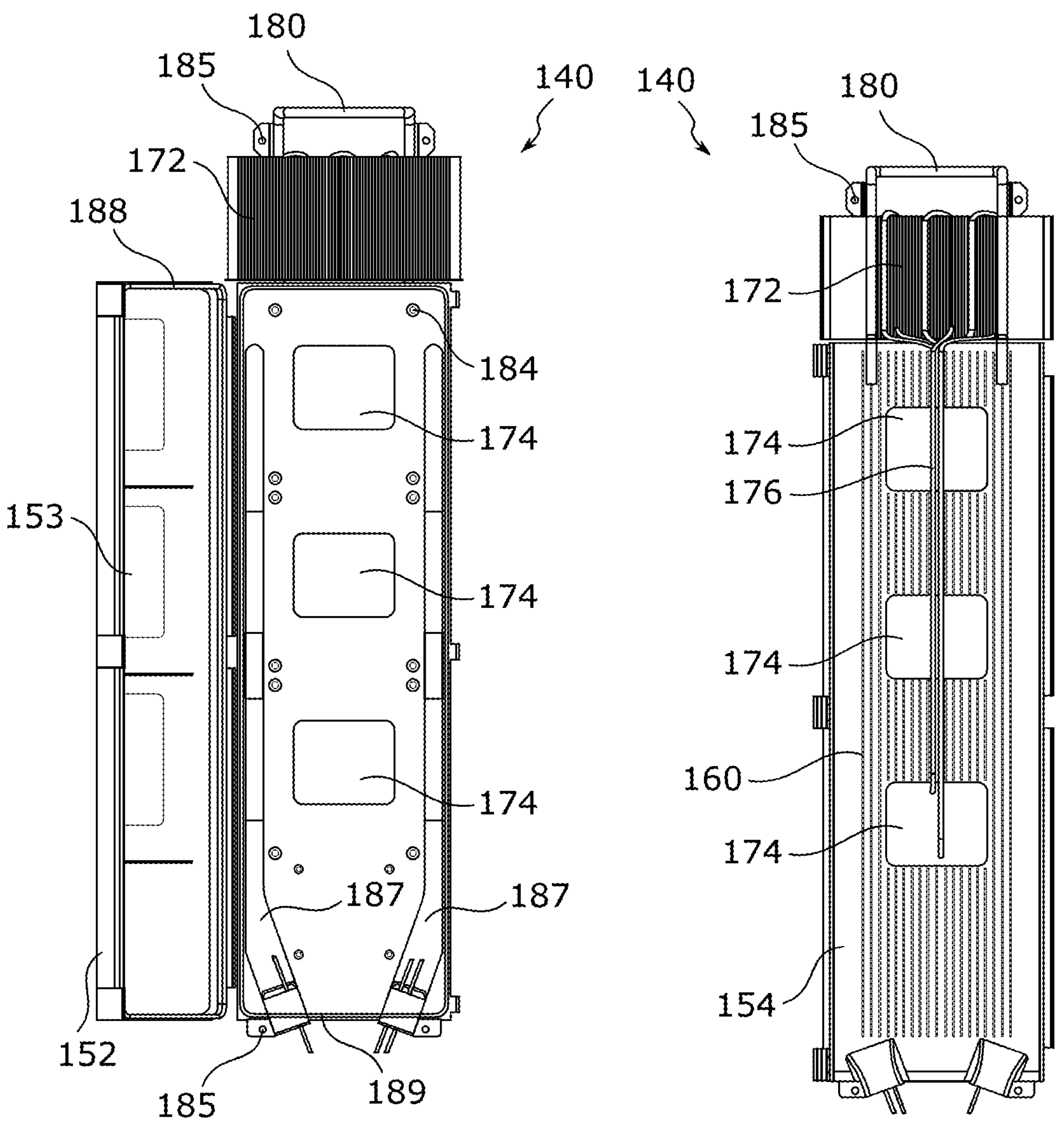
FIGS. 1F and 1G schematically illustrate front and back views, respectively, of an embodiment of a cooling module according to the present disclosure, and FIGS. 2A-C schematically illustrate perspective views of various embodiments of street poles according to the present disclosure.

FIG. 1F schematically illustrates a front view of a module 140. The module 140 may for example be equal to the module 140 described with reference to FIGS. 1A-E. In FIG. 1F, a door of the enclosure is open such that the inside of the enclosure is visible. The door may for example correspond to all or part of the first outer side 152 of the enclosure. The inside of the door includes a seal 188 (in form of e.g. a sealing ring) extending around an outer perimeter of the inside of the door, and a corresponding groove 189 is provided along an outer perimeter of the inside of the enclosure. When the door is closed, the seal 188 may fit inside the groove 189 and create a weather sealing of the enclosure, such that whatever is arranged therein is protected from e.g. rain and other environmental factors. On the inside of the enclosure, various means 184 for mounting one or more radio modules/equipment are provided. The means 184 may for example be threaded holes in which screws may be inserted, or similar. In the particular example illustrated in FIG. 1F, there are means 184 for mounting three radio modules/equipment, but the number of means 184 may of course be different and adjusted as desired. As can be seen in FIG. 1F, there are also three heat absorber units 174 located behind each mounting spot for the radio modules/equipment. As these heat absorber units 174 are connected to the heat emitter unit 172, the radio modules/equipment can be configured such that their hottest parts (i.e., the parts which generate the most heat during operation) coincide with the location of the heat absorber units 174 when mounted. This may provide an increased cooling at these locations.

The inside of the module 140 also includes various grooves/channels 187 for the routing of (e.g. electrical, data, power and/or fiber optical) cables and other connectors to/from the various radio modules/equipment. As the enclosure of the module 140 is weather sealed, the radio modules/equipment themselves do not need their own weather sealing, and the same applies also to their various connectors and similar, resulting in a reduced cost of the overall assembly and network node. It should also be noted how, due to the internal grooves/channels 187, all or most cables needed for the assembly and module 140 can be routed internally, and thus without negatively affecting the visual appearance of the assembly for an outside spectator.

The module 140 further include attachment means 185 for attaching the module 140 to the support structure of the assembly. In this particular example, the attachment means 185 are holes through which screws may be inserted and then screwed to the support structure. The support structure may for example have corresponding threaded holes, ready to accept the screws. Other types of attachment means 185 are also envisaged.

As described earlier herein, some or all of e.g. the handle 180, the system 170 including the heat emitter unit 172 and the heat absorber units 174 (as well as the corresponding conduits), etc., may be optional and not included as part of the envisaged assembly and module.

By providing a door to the inside of the enclosure of the module 140, access to the radio modules/equipment inside is facilitated and things such as installation, service, repair and replacement of the radio modules/equipment can be made more easily to perform. In particular, it is envisaged that the inside of the enclosure of the module 140 is accessible without having to first remove the module 140 from the support structure and the assembly. As described earlier herein, if the module 140 is however needed to be removed from the support structure and the assembly, this can be achieved without affecting the remaining modules and the assembly as a whole, such that service, upgrade and repair can be performed on one module without having to also disable the other modules. It is envisaged that the support structure on its own may provide all of the mechanical rigidity needed to uphold e.g. a lighting arrangement mounted to the tubular section, such that one, a few or all of the modules may be removed without having to also dismantle such a lighting arrangement. This can be important if the lighting arrangement is e.g. a traffic light, a streetlight, or similar, whose functionality should not be compromised only due to the existence and eventual repair needs of the assembly.

Additionally, as each module 140 is weather sealed on its own, opening the door of one module 140 does not affect the weather sealing of the other modules.

FIG. 1G schematically illustrates a back view of the same module 140 as in FIG. 1F, illustrating in more detail the various arrangements of e.g. the heat absorber units 174, the conduits 176, the heat emitter unit 172, the heatsinks 160 mounted to the second outer side 154, etc. In other embodiments of a module as envisaged herein, the exact placement (or even the very existence) of these elements may of course vary.

The present disclosure also envisages a network node which includes a cooling module assembly (or just "assembly") as described herein. The assembly may for example be the assembly 100 or 101 described with reference to Figures TA-E, or any other embodiments thereof. In the network node, there is at least one radio module/equipment mounted within each enclosure 150 of the two or more cooling modules 140. In some embodiments, it is envisaged that the network node is configured to serve a number of sectors, and that the assembly then includes one module for each such sector, as touched upon earlier herein. To avoid repeating already made statements, no illustration or further description of such a network node will be provided herein.

Generally herein, it should be noted that a "radio module" or "radio equipment" can be e.g. any module configured for communication with for example cell phones, a backhaul radio link for connection of the network node to other nodes of the network, a baseband unit, etc. Preferably, any such module includes at least one antenna, and in particular an antenna which needs to be provided in an urban environment and preferably hidden from public view, or at least made sufficiently visually appealing for the public not to complain about its presence.

Finally, various embodiments of street poles according to the present disclosure will now be described with reference to FIGS. 2A-C.

Figures 2A, 2B, 2C:
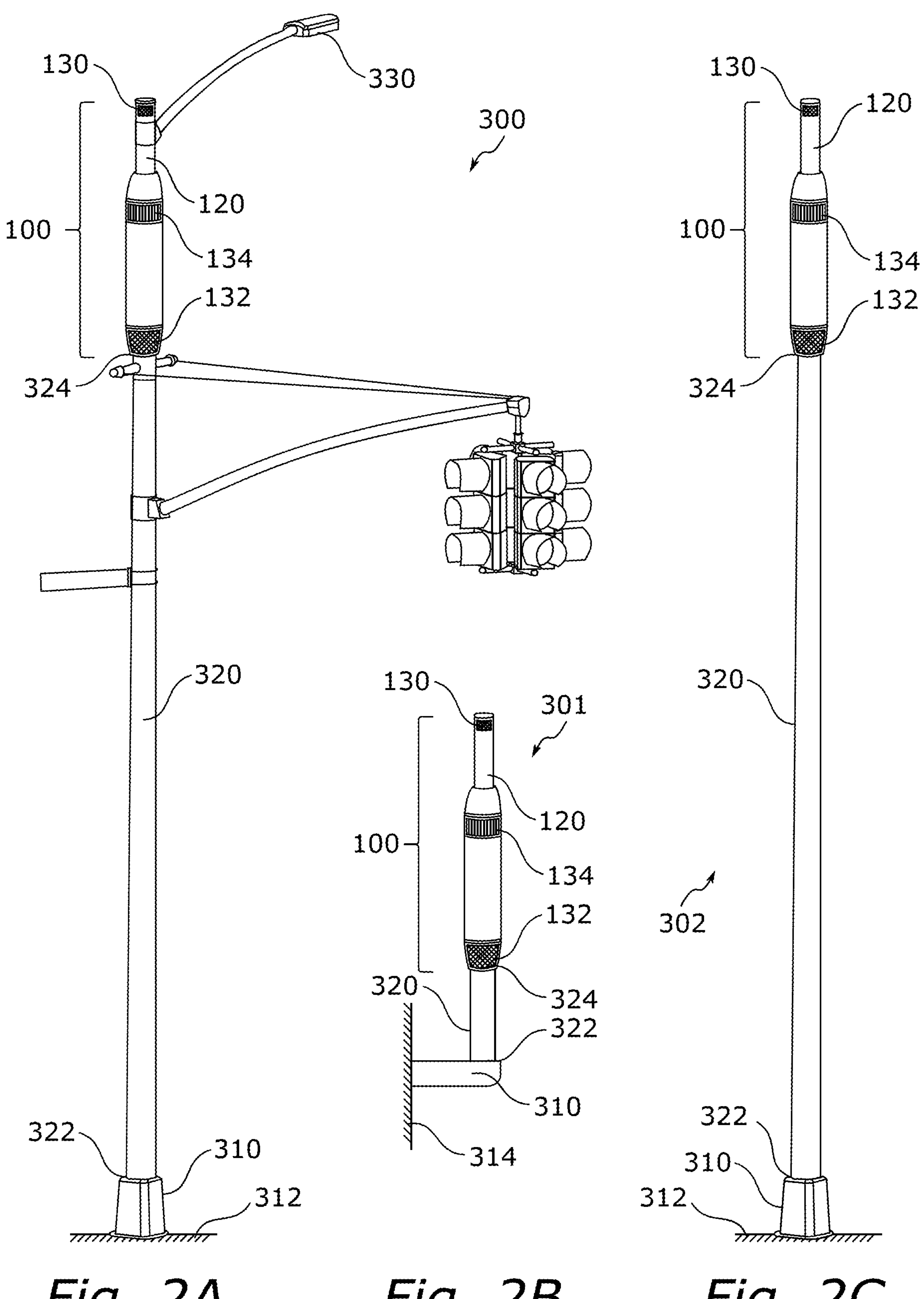

FIG. 2A schematically illustrates a perspective view of a street pole 300 in form of a traffic light. The traffic light 300 includes a base 310, with which the traffic light 300 is mounted to a ground structure 312 such as e.g. a sidewalk. The traffic light 300 includes a pole structure 320 which has a first end 322 and a second end 324. The first end 322 is attached to the base 310. The traffic light 300 further includes a network node as described herein, in particular including an assembly 100. The support structure of the assembly 100 is mounted to the second end 324 of the pole structure 320, such that the appearance of the assembly 100 is that it is just an extension (or even part of) the pole structure 320. To further enhance such an appearance, a lighting arrangement in form of a streetlight 330 is mounted to the tubular section 120 of the assembly 100. As described herein, the tubular section 120 provides a chimney effect within the inner air channel of the assembly 100, where air enters through the bottom air inlet 132, flows through the inner air channel, via the tubular section 120, and finally exits through the air outlet 130 at the top of the tubular section 120. There is also a second air inlet 134 formed e.g. by the (fluid-based heat exchanging) system of the assembly, but as discussed earlier herein such a second air inlet and system may both be optional. This applies to all of the embodiments described with reference to, and illustrated in, FIGS. 2A-C.

FIG. 2B schematically illustrates a perspective view of another street pole 301, in form of a wall mounted pole. The wall mounted pole 301 includes a pole structure 320 mounted to a wall structure 314 of e.g. a building, using a base 310. The pole structure 320 has a first end 322 and a second end 324. The first end 322 is attached to the base 310, and the base 310 extends out from the wall structure 314 such that the pole structure 320 can be mounted at a distance from the wall structure 314.

At the second end 324 of the pole structure 320, the network node and in particular the assembly 100 is mounted (using its support structure) such that it extends in a vertical direction. As before, the air flow enters the bottom air inlet 132, goes through the inner air channel of the assembly, is accelerated by the added tubular section 120, and finally exists through the air outlet 130 on top of the tubular section 120. Here, no lighting arrangement is attached to the tubular section 120. However, it may be envisaged that the pole section 320 was originally for holding e.g. a street sign (not shown), such as a stop sign or similar, or to mount some form of lighting arrangement to the wall structure 314. Although not illustrated in FIG. 2B, it is envisaged that any such arrangement may still be mounted, but instead to the tubular section 120. This may preserve the intendent functionality of the pole structure 320, and make the assembly 100 and the network node more seamlessly blend in with the urban environment.

FIG. 2C schematically illustrates a perspective view of another street pole 302, in form of a utility pole. The utility pole 302 has all of the same elements as e.g. the street pole 300 described with reference to FIG. 2A, except that there is no traffic light and additional lighting arrangement included. The utility pole 302 may however be originally intended to hold up some form of structure from the ground, and it may then be envisaged that this structure may instead be mounted to the tubular section 120 instead of directly to the pole structure 320, which provides the same benefits in terms of visual appearance as described earlier herein. In other embodiments, the utility pole 302 may have the sole purpose of supporting the assembly 100.

Before summarizing the contribution of the present disclosure, it should be reminded that the currently available technology includes various radio products which are often box-shaped, and which often rely on passive heatsinks which are arranged to be cooled by outside ambient air. To cover multiple sectors, many such radio products (such as antennas and additional equipment) are mounted around solid poles such that they together cover the desired number of sectors. Such arrangements can often be seen on the top of buildings, or in cell towers and similar. When moving to higher frequencies, the usable distance coverage of these products is reduced due to the decreased wavelengths of the radio signals which need to be transmitted and received. This requires the products to be moved closer to the user, and especially placed in urban environments where they can be both visually disturbing and distracting. In order to camouflage such installations, the products in each installation (e.g. the various antenna enclosures, each covering a single sector) need to be placed closer together such that external shrouds can be provided around them, without exceeding limitations with respect to overall size. This adds complexity, costs, and at the same time reduces both cooling efficiency and may also interfere with the radio transmission. If trying to counter the reduced cooling efficiency by installing one or more mechanical fans, this also increases cost, complexity and the risk of failure.

To summarize the present disclosure, it has in particular been provided an improved cooling module and an improved way of arranging such modules in an assembly, wherein the cooling modules themselves form an enclosed, inner air channel through which air can flow. The support structure carries the weight of the modules, and is such that it does not interfere with the inner air channel (thereby removing the need to mount the modules around a solid pole, as is otherwise done in already available technology). Due to the chimney effect created by the addition of the tubular section on top of the support structure, the modules can be made more compact and placed closer together than otherwise, as the improved air flow created by the chimney effect helps to provide sufficient cooling of the modules and the radio modules/equipment placed therein. Further, as the outer shapes of the modules are adapted and configured to also define the outer shape of the assembly as a whole, there is no need for additional camouflage in form of e.g. a shroud, and the overall outer shape can be tailored such that it seamlessly blends in with existing urban structures such as street poles. As illustrated herein, the proposed assembly and network node may even be provided as an addition to existing street poles, wherein the tubular section may be used to hold e.g. lighting arrangements, street signs, or similar, and wherein the outer shape of the assembly is such that it appears as if originally being a part of the street pole structure in question. The assembly is cooled using passive or active (liquid) cooling, either by only the air flow provided by the chimney effect in the inner air channel, or additionally also by the provisioning of a fluid-based heat exchanging system which further enhances the cooling, and also possibly the chimney effect. In some embodiments, an assembly of at least one larger-diameter fan could also be added to increase both air flow and cooling capacity. Larger fans can run at lower RPM compare to smaller fans as currently used in millimeter-wave radios and already available network products, and could thus emit lower noise levels than currently available network node products. A larger fan could also be expected to have an increased lifetime compared to multiple smaller fans, in particular as a single fan provides only one possible point of failure, while a plurality of smaller fans provides multiple possible points of failure, thus increasing the risk of at least one fan failing (which often requires service/repair of the whole assembly of already available network node products). The modules are weather sealed individually, and their enclosures include radome sections for the antennas as needed. Consequently, no additional outer enclosure containing all of the modules is needed, which further helps to reduce the overall size of the assembly and network node, and thereby also enhances the visual appearance. The provided cooling module and cooling module assembly are also more flexible in terms of installation, repair, replacement and upgrading, as individual modules can be accessed and even removed without affecting the other modules.

Although features and elements may be described above in particular combinations, each feature or element may be used alone without the other features and elements or in various combinations with or without other features and elements.

Additionally, variations to the disclosed embodiments may be understood and effected by the skilled person in practicing the claimed invention, from a study of the drawings, the disclosure, and the appended claims. In the claims, the words "comprising" and "including" does not exclude other elements, and the indefinite article "a" or "an" does not exclude a plurality. The mere fact that certain features are recited in mutually different dependent claims does not indicate that a combination of these features cannot be used to advantage.

LIST OF REFERENCE NUMERALS

100, 101 cooling module assembly
110 support structure
112 attachment means
114 first (bottom) end
116 second (top) end
120 tubular section
130 air outlet
132, 134 air inlet
136 enclosed inner air channel
140 cooling module
150 enclosure
152 first outer side
153 radome section
154 second outer side
160 heatsink
170 heat exchanging system
172 heat emitter unit
174 heat absorber unit
176 conduit
180 handle
185 attachment means
187 cable channel
188 seal
189 groove
300, 301, 302 street pole
310 base
312 ground structure
314 wall structure
320 pole structure
322 first end
324 second end
330 lighting arrangement
L longitudinal axis
$F_{1-5}$ air flow

The invention claimed is:

1. A cooling module assembly (100, 101) for a network node in a telecommunication network, comprising:
a support structure (110) having a longitudinal axis (L);
attachment means for (112) attaching a first end (114) of the support structure to a pole;
a tubular section (120) extending along the longitudinal axis from a second end (116) of the support structure, away from the first end, and to an air outlet (130);
an air inlet (132) arranged at the first end, and
at least two cooling modules (140) each mounted to the support structure,
wherein each of the at least two cooling modules includes:
an enclosure (150) including a first outer side (152) facing away from the longitudinal axis and a second outer side (154) facing towards the longitudinal axis, wherein the first outer side includes at least one radome section (153) and the second outer side forms part of an enclosed inner air channel (136) of the assembly, the inner air channel extending along the longitudinal axis between the air inlet to the air outlet via the tubular section;

means (184) for mounting one or more radio modules within the enclosure, and one or more heatsinks (160) arranged on the second outer side and within the inner air channel, and in thermal contact with an inside (156) of the enclosure.

2. The assembly according to claim 1, further comprising a fluid-based heat exchanging system (170) including:

a heat emitter unit (172) arranged at the second end of the support structure and at least partially in thermal contact with the inner air channel;

one or more heat absorber units (174) arranged in thermal contact with one or more of the insides of the enclosures of the at least two cooling modules, and one or more conduits (176) forming one or more loops between the heat emitter unit and the one or more heat absorber units.

3. The assembly according to claim 2, wherein the fluid-based heat exchanging system is formed by multiple subsystems, each included as part of a respective one of the at least two cooling modules.

4. The assembly according to claim 2, wherein the fluid-based heat exchanging system is so arranged that it provides a second air inlet (134) to the internal air channel.

5. The assembly according to claim 2, wherein the fluid-based heat exchanging system is a two-phase system, the heat emitter unit is a condenser unit, and the one or more heat absorber units are one or more evaporator units.

6. The assembly according to claim 2, wherein the fluid-based heat exchanging system is a single-phase system.

7. The assembly according to claim 2, wherein the fluid-based heat exchanging system further includes at least one pump for actively circulating a cooling liquid in said one or more loops.

8. The assembly according to claim 2, wherein the heat emitter is arranged closer to the air outlet than the parts of the inner air channel formed by the second outer sides of the two or more cooling modules.

9. The assembly according to claim 1, including exactly two or three cooling modules.

10. The assembly according to claim 1, wherein the second outer sides of the cooling modules define at least part of an outer shape of the assembly.

11. The assembly according to claim 10, wherein the outer shape of the assembly is cylindrical or oval.

12. A cooling module (140) for a cooling module assembly (100, 101) for a network node in a telecommunication network, comprising:

an enclosure (150) including a first outer side (152) and a second outer side (154), the first outer side including at least one radome section;

means (184) for mounting one or more radio modules within the enclosure, and one or more heatsinks (160) arranged on the second outer side and in thermal contact with an inside of the enclosure, wherein the cooling module is further so configured that, when mounted to a support structure (110) of the cooling module assembly having a longitudinal axis (L), together with one or more other such cooling modules:

the first outer side faces away from the longitudinal axis, and the second outer side faces towards the longitudinal axis and forms at least part of an enclosed inner air channel (136) of the assembly, formed between the second outer sides of the cooling module and the one or more other such cooling modules, such that the one or more heatsinks are arranged within the inner air channel.

13. The cooling module according to claim 12, further comprising a fluid-based heat exchanging system (170), including:

a heat emitter unit (172) configured to be in thermal contact with the inner air channel;

one or more heat absorber units (174) arranged in thermal contact with the inside of the enclosure, and one or more conduits (176) forming one or more loops between the heat emitter unit and the one or more heat absorber units.

14. The cooling module according to claim 13, wherein the fluid-based heat exchanging system is a two-phase system, the heat emitter unit is a condenser unit, and the one or more heat absorber units are one or more evaporator units.

15. The cooling module according to claim 13, wherein the fluid-based heat exchanging system is a single-phase system.

16. The cooling module according to claim 13, wherein the fluid-based heat exchanging system further includes at least one pump for actively circulating a cooling liquid in said one or more loops.

17. A network node for a telecommunication network, comprising a cooling module assembly (100, 101) according to claim 1, and at least one radio module mounted within each enclosure (150) of the two or more cooling modules (140).

18. The network node according to claim 17, wherein the network node is configured to serve a number of sectors, and wherein the cooling module assembly includes one cooling module for each sector.

19. A street pole (300, 301, 302), comprising:

a base (310) for attaching to a ground structure (312) or a wall structure (314);

a pole structure (320) having a first end (322) and a second end (324), wherein the first end is attached to the base, and a network node according to claim 17, wherein the support structure (110) of the cooling module assembly (100) of the network node is mounted to the second end of the pole.

20. The street pole according to claim 19, further including a lighting arrangement (330) attached to the tubular section (120) of the cooling module assembly.

* * * * *